United States Patent

Fujikawa et al.

[11] Patent Number: 5,979,306
[45] Date of Patent: Nov. 9, 1999

[54] HEATING PRESSURE PROCESSING APPARATUS

[75] Inventors: Takao Fujikawa; Yutaka Narukawa; Itaru Masuoka; Takahiro Yuki; Yoshihiko Sakashita, all of Takasago, Japan

[73] Assignee: Kabushiki Kaisha Kobe Seiko Sho, Kobe, Japan

[21] Appl. No.: 09/047,402

[22] Filed: Mar. 25, 1998

[30] Foreign Application Priority Data

Mar. 26, 1997 [JP] Japan ................................ 9-073892

[51] Int. Cl.⁶ ........................................ B30B 15/34
[52] U.S. Cl. .......................... 100/90; 100/305; 100/317; 118/719; 118/725
[58] Field of Search ...................... 100/90, 305, 315–317, 100/269.01; 118/719, 725

[56] References Cited

U.S. PATENT DOCUMENTS

| | | | |
|---|---|---|---|
| 5,297,480 | 3/1994 | Miyashita et al. | 100/90 |
| 5,518,771 | 5/1996 | Jeffryes et al. | 118/50 |
| 5,735,196 | 4/1998 | Jordan et al. | 100/90 |
| 5,792,271 | 8/1998 | Fujikawa et al. | 118/719 |

*Primary Examiner*—Stephen F. Gerrity
*Attorney, Agent, or Firm*—Oblon, Spivak, McClelland, Maier & Neustadt, P.C.

[57] ABSTRACT

A heating pressure processing apparatus in which gas sealing property and safety can be ensured, and economic property can be improved in heating pressure processing of workpieces such as Si wafers sheet by sheet. A processing vessel 1 formed of vessel components 2, 3 is divided into at least two parts or more in the axial direction thereof and has a seal ring 9 provided in the divided parts of the vessel components 2, parts 3 in such a manner as to be replaceable. The vessel components 2, 3 have shaped parts forming a processing space 5 for a workpiece 4 when the divided parts are sealed through the seal ring 9, the vessel components 2, 3 also having cooling means 10 for the seal ring 9. A ram is provided 18 for pressing the vessel components 2, 3 in the axial direction of the vessel in order to ensure the sealing in the divided parts; and a gas introducing device 20 is provided for introducing a pressurized gas to the processing space 5 in order to process the workpiece.

17 Claims, 5 Drawing Sheets

F I G. 1A
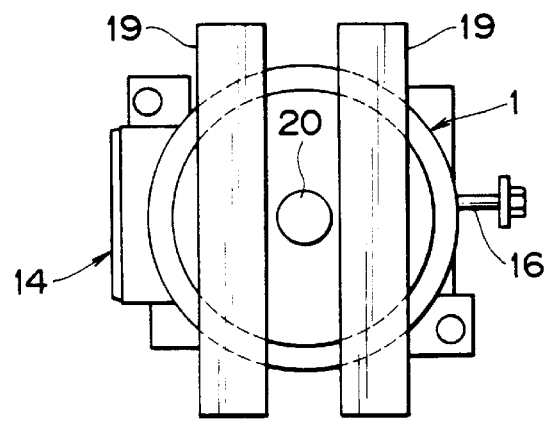
F I G. 1B
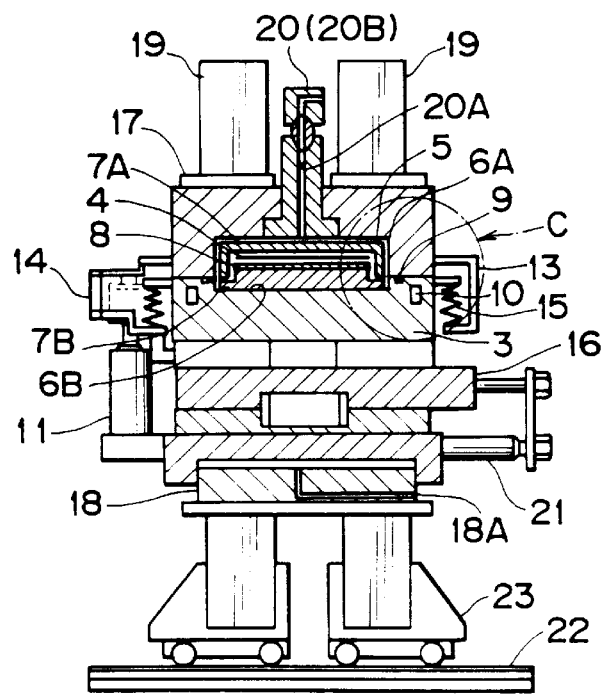
F I G. 1C
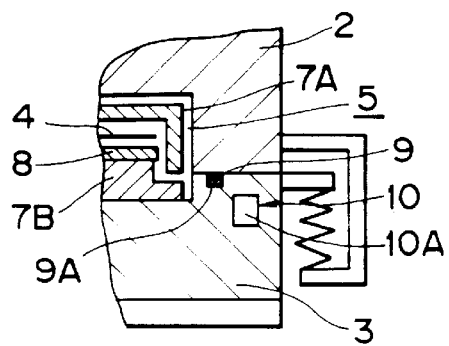

HEATING PRESSURE PROCESSING APPARATUS

BACKGROUND OF THE INVENTION

1. Field of the Invention

This invention relates to a high-pressure gas processing apparatus for performing hot isostatic pressing (HIP), high-pressure gas oxidation or nitration, or washing by use of a fluid in super-critical state, or a heating pressure processing apparatus employed for a solid workpiece which is to be batch processed. More particularly, it relates to an apparatus for processing a plate-like workpiece such as Si wafer one by one in a short cycle.

2. Description of the Related Art

In the manufacture of Si semiconductor or ULSI, recently, a so-called sheet-by-sheet type of processing wafers one by one in a cycle time of several minutes is increasingly dominant from the viewpoint of productivity and quality management. On the other hand, the batch type process using high-pressure which is most widely applied in industry is HIP method (hot isostatic pressing method). However, this HIP method generally requires 3–5 hours for one cycle even in a short-time processing with a small-sized apparatus.

In the application of the process utilizing a high-pressure gas to the single-wafer processing of semiconductors, shortening of cycle time is an important subject. Although the ratio of time occupied by a step such as pressurization and heating is high in the process itself, the time required for loading and unloading the Si wafer which is the workpiece also accounts for an extremely high ratio.

In this connection, an HIP apparatus used for general HIP method has no hindrance even if the loading and unloading of the workpiece requires a time of the order of several tens minutes, because the whole cycle time is on the order of several hours or more.

For a high pressure apparatus for processing Si wafers sheet by sheet, the loading and unloading mechanism of workpiece which requires much time as in the HIP apparatus can not be adapted, and an apparatus shown in FIG. 6 is proposed as a pressure recess-filling apparatus for interconnection film (Japanese Patent Laid-Open No. 7-502376).

Japanese Patent Laid-Open No. 7-502376 proposes a processing system comprising a plurality of skin parts (high pressure vessel components) 100, 101; first means 102, 103 for pressing the skin parts 100, 101 so as to mutually contact, the skin parts 100, 101 being shaped so that they are pressed and closed by the first means 102, 103 to form a sealing space 104 for a workpiece W; second means 105 for supplying a pressurized gas of atmospheric pressure or more to the internal space 104 in order to process the workpiece W by exposing the workpiece W to a high pressure; and means 106 for exhausting the pressure vessel.

Namely, referring to FIG. 6, in this conventional technique, the high pressure vessel parts 100, 101 forming the sealing space 104 for housing a workpiece (Si wafer) are divided substantially on the sides of the workpiece W, so that the workpiece W is moved in and out sideways through a passage 107 by the narrow divided space, and this structure is suitable to load and unload a thin plate-like workpiece one by one within a short time with a high-pressure gas.

Although a large subject in the structure for opening and closing the high-pressure vessel in this way is the gas sealing structure of the divided part, it is attained in this conventional technique by pressing a specific sealing structure part by the first means (gas pressure and hydraulic rams).

To press the high-pressure vessel member by gas pressure, particularly, it is proposed that the first means comprises an actuator 103 for moving one of the skin parts, and the second means 105 is arranged so as to supply a pressurized gas to the actuator for the operation of the actuator 103. This supposingly means that the pressure receiving area of the ram of the first means for supplying the pressurized gas is set larger than the axial sectional area of the space for sealing the workpiece, whereby the seal part of the sealed space part is regularly in the pressed state during the execution of the processing by the pressurized gas.

In FIG. 6, denoted at 110 is a yoke, which is cylindrically formed and has upper and lower plugs 111, 112 screwed to the upper and lower parts thereof.

It may be said that the structure of the conventional technique disclosed in Japanese Patent Laid-Open No. 7-502376 outlined in reference to FIG. 6 is suitable for the single-wafer processing of a plate-like workpiece as Si wafer by use of a high-pressure gas, but this structure has the following problems:

1) Since a heat source such as heater is housed in the high-pressure vessel in processing at high temperature, the temperature of the seal part is raised, and the stability of the seal is lost when the processing is performed for a long time or in a cycle of a number of times, although no problem arises in processing at about room temperature. In order to avoid this, a specific sealing structure mainly composed of metal is adapted in the conventional technique.

Namely, a seal 109 for the internal space 104 moves a lip formed in the upper part of the skin part 101 to the outside and firmly presses it to the skin part 100 in the seal surface to deform the lip so that the strength of the seal is increased in proportion to the raised pressure of the sealing space 104 (referred to the bottom line of the right upper column to the fifth lines of the left lower column, page 4 of the gazette thereof).

However, the sealing by the deformation of the lip has a subject that the lip is plastically deformed when the processing is performed in a cycle of a number of times, and the sealing function can not be exhibited as soon as the plastic deformation is caused.

Further, the plastic deformation of the lip also introduces a subject that the skin part itself must be replaced to ensure the sealing function since the lip is integrated to the skin part 101.

2) The conventional technique has two pressing means (first means) of the hydraulic actuator 102 and the gas pressure actuator 103 in order to mutually close a plurality of vessel components (skin parts) 100,101. In this case, however, a high pressure substantially equal to the pressure within a processing chamber (internal space) 104 is generated by the hydraulic actuator 102 together with the other gas pressure actuator 103 to enhance the probability of causing a trouble such as pressure leak. This can not be said to be preferable from the viewpoint of safety as well as it leads to a reduction in reliability of the apparatus.

3) The conventional technique is designed, as an example, so that the gas in the processing space 104 is carried into the actuator 103 through a valve 108 to produce a force for closing the high-pressure vessel in the actuator 103 having a pressure receiving area larger than the axial sectional area of the processing space 104. However, this means that the gas after use is passed through the inner part of the actuator 103, which brings on the entrainment of the dust resulted from the wear of the seal member within the actuator into the recovered gas, and a question is left for the recycle of the gas.

Namely, although it is allowed to dispose the gas (non-recovery type) when the processing frequency is less, recovery type such as forced recovery or differential recovery is adapted for production from the viewpoint of economic property. In this case, the dust is included in the recovered gas, introducing the danger of causing a contamination when transferred to the processing space.

SUMMARY OF THE INVENTION

In order to solve the problems (subjects) described above, an object of this invention is to ensure sealing property and safety and improve economic property with respect to the operation in an apparatus for processing plate-like workpieces as Si wafers sheet by sheet with a high-pressure gas.

Accordingly, this invention adapts the following technical means in order to achieve the above object in an apparatus for heating and pressure processing plate-like workpieces under a gas atmosphere.

Namely, this invention provides a heating pressure processing apparatus comprising a high-pressure vessel formed of a plurality of vessel components, the vessel components being mutually closed to form a closed processing space; an actuator for moving the vessel components of the high-pressure vessel in the axial direction thereof; a heater provided in the high-pressure vessel; gas introducing means for introducing a pressurized gas into the processing space; sealing means fitted to the contact parts of the vessel components; and pressing means for pressing the vessel components in the axial direction thereof. The sealing means fitted to the contact parts of the vessel components is combined with the pressing means for pressing the vessel components in the axial direction thereof, whereby the sealing property in the divided part of the vessel components is more ensured to prevent a leakage of the gas introduced into the processing space.

The apparatus according to this invention further comprises a frame for supporting a load acting in the axial direction of the high-pressure vessel in high-pressure processing the workpiece within the high-pressure vessel, and retractable cotter means for transmitting the load acting in the axial direction of the high-pressure vessel to the frame. According to this structure, the load in the axial direction of the vessel by the high-pressure gas is supported by the frame through the cotter means when the high-pressure vessel is filled with the high-pressure gas. Thus, a highly safe support structure of load is provided.

Further, the press is shaped in a window frame, whereby an apparatus compact as the whole and excellent in safety can be provided. Namely, in a window frame type press frame body, the sectional area of a column part is regulated, whereby the axial elongation can be substantially optionally set, and the stress level is regulated, whereby a design can be made, including a fatigue evaluation as resistant to use at a level of 10,000,000 times or more even to the use of a high pressure exceeding 1000 kgf/cm$^2$.

The gas introducing member of the gas introducing means is further provided on the axial center of the vessel, and the window frame-like press frames are provided on both sides between the introducing member between in such a manner as to be movable near and away on both the sides with the introducing member between to be engaged with and disengaged from both end surfaces of the vessel. By adapting such a structure, the turbulence of temperature within the high-pressure gas processing space which occurs in high-speed supply of the high-pressure gas indispensable in high-temperature high-pressure gas processing in a short cycle, e.g., several minutes/cycle, can be made axially symmetric, and the management of temperature distribution of the workpiece is facilitated.

It is preferred to use, as a seal ring, an elastic body excellent in follow-up property to extension of clearance in the divided part.

In the respect of elastic body, resins including rubber series have the most elastic characteristic, or the characteristic capable of following even a large deformation, but they have a disadvantage of insufficient heat resistance. Therefore, silicon resin or fluorine resin excellent in heat resistance can be adapted, but their limit of general use is about 300° C. at the most.

In this invention, accordingly, a resin-made seal ring relatively excellent in heat resistance is used, and cooling water is introduced to either one or both of the upper vessel component and the lower vessel component so that the temperature of the seal ring part is held under the heat resisting temperature of the used resin.

As the seal ring, a superelastic metallic material such as nickel, titanium alloy, copper-zinc alloy and the like can be, of course, adapted without being limited to the above resins.

Since the seal ring is replaceable, replacement of only the seal ring suffices for the deterioration of the sealing property by the seal ring, and the replacement together with the vessel components is not required.

The above-mentioned pressing means is formed of a ram using gas pressure having a pressure medium chamber to which the pressurized gas of the gas introducing means can be introduced, and the pressure receiving area of the ram is set larger than the pressure receiving area of the processing space. By adapting such a structure, the gas of the same pressure as the gas filled in the high-pressure gas processing space is basically introduced into the gas pressure ram, so that the upper and lower vessel components are regularly kept in the mutually closely fitted state at the parting plane as long as the gas pressure is supplied, and the high-pressure gas within the high-pressure gas processing space can be prevented from being leaked through the parting plane to the outside by the synergistic effect with the sealing effect of the seal ring which is the elastic body.

The pressurizing means is also formed of a ram utilizing gas pressure in which check valves for allowing the gas flow from feed side to recovery side and arresting the reverse directional gas flow are provided on the feeding and recovering lines of the pressure medium gas to and from the ram. By adapting such a structure, dust (particle) such as abrasive powder generated by the wear of the gas seal ring within the ram, even if included in the gas supplied into the gas pressure ram, can be prevented from being transferred into the high-pressure gas processing space to cause a contamination.

The pressurizing means is otherwise formed of a ram using gas pressure in which a filter for removing the dust in the recovered gas is provided on the recovering line from the ram or a recovering vessel. By adapting such a structure, the gas can be surely recovered and recycled.

As the pressurizing means, a ram using hydraulic pressure can be also used instead of the ram using gas pressure.

BRIEF DESCRIPTION OF THE DRAWINGS

FIG. 1 (A) is a plane view of one embodiment of a heating pressure processing apparatus of this invention during process.

FIG. 1 (B) is a side sectional view of one embodiment of a heating pressure processing apparatus of this invention during process.

FIG. 1 (C) is an essential part enlarged view of one embodiment of a heating pressure processing apparatus of this invention during process.

DESCRIPTION OF THE EMBODIMENT OF THE INVENTION

Figure 2:
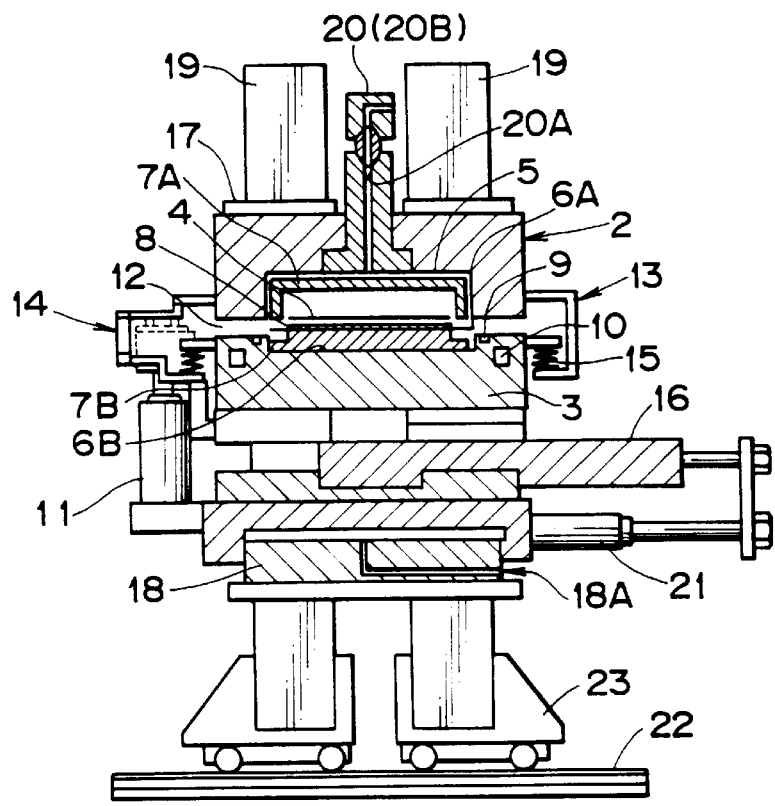
FIG. 2 is a side sectional view showing the embodiment of this invention during opening.

A preferred embodiment of this invention will be described in detail below in reference to the drawings.

In FIG. 1 (A) showing a plane view of a heating pressure processing apparatus according to this invention in a process where a pressure vessel is filled with a high-pressure gas and a high-temperature high-pressure processing is carried out, FIG. 1 (B) showing a side sectional view thereof, and FIG. 1 (C) showing an enlarged essential part of FIG. 1 (B), a pressure vessel 1 is cylindrical, and formed of vessel components divided into at least two parts or more in the axial direction thereof (hereinafter referred to as an upper member 2 and a lower member 3). Shaped parts 6A, 6B for forming a processing space 5 for a plate-like workpiece 4 such as Si wafer are formed in the divided parts by denting the upper and lower members 2, 3 in the axial direction thereof.

In the processing space 5, a lower heat insulating structure 7B is placed on the part 6B of the lower member 3, a heater 8 which is a heating element is provided on the structure 7B, and an upper heat insulating structure 7A is provided on the part 6A of the upper part 2, so that the heat insulating structures 7A, 7B prevent the dissipation of an excessive heat. The upper heat insulating structure 7A is shaped in a sectionally inverted cup, and supported by the upper member 2.

A seal ring 9 is provided in the divided part in such a manner as to be replaceable to surround the circumference of the housing space 5, and a cooling means 10 for the seal ring 9 is also provided.

As shown in FIG. 2, the upper and lower members 2, 3 can be vertically isolated from the divided part by the operation of a raising and lowering actuator 11, a passage 12 for loading a workpiece 4 to be processed is formed in the processing space 5 in this isolated state, and the passage 12 is circumferentially enclosed by a vacuum chamber 13. The vacuum chamber 13 has a carrying port 14 for the workpiece 4, the chamber 13 is connected to the lower member 3 by an expansible and contractible bellows circumferential wall 15 in order to follow the axial movement of the upper and lower members 2, 3 and ensure the vacuum, and a load in the circumferential direction of the vessel and a load in the axial direction thereof are generated in the upper member 2 and the lower member 3 by the pressure of the high-pressure gas when heating pressure processing is performed in the vessel 1. The circumferential stress is determined by designing the optimum radial thickness of each vessel. The load (axial force) generated in the upper member 2 and the lower member 3 is finally supported by a window frame type press frame 19 through a cotter 16, a pressure plate 17, and a gas pressure rum 18 having a gas inlet port 18A which is the pressing means. The axial load actually acts in the direction of isolating both the vessels at the parting plane of the upper member 2 and the lower member 3. This load acts in the direction of extending the column part 19A of the press frame 19 and compressing the cotter 16 and the member in the space nipped by an upper platen and a lower bottom in the press frame 19. Therefore, a force likely to isolate the upper and lower members 2, 3 is regularly generated at the parting plane of both the members 2, 3.

When the upper and lower members begin to isolate at the parting plane by this force so that the seal ring 9 can not contact them, the high-pressure gas in the high-pressure gas space is leaked out, and it becomes impossible to execute a desired high-temperature high-pressure processing.

One method for preventing the leakage of high-pressure gas by the isolation is to use an elastic body excellent in follow-up property to extension of clearance in the isolation of both the members 2, 3 for the seal ring 9. In the respect of elastic body, resins including rubber series have the most elastic characteristic, or the characteristic capable of following even a large displacement. However, they have a disadvantage of insufficient in heat resistance, and even silicon resin or fluorine resin excellent in heat resistance has a limit of general use of about 300° C. at the most. In this invention, such a resin-made seal ring 9 relatively excellent in heat resistance is used, and the cooling means 10 for introducing cooling water is provided on either one or both of the upper member 2 and the lower member 3, whereby the seal ring part is held under the heat resisting temperature of the used resin even if the temperature of the seal ring is raised.

The second method is to use a gas pressure ram 18 for regularly closely fitting the upper member 2 to the lower member 3 at the parting plane to the above-mentioned axial load. To the gas pressure ram 18, a gas of the same pressure as the gas filled in the high-pressure gas processing space 5 is basically introduced. Therefore, in order to regularly closely fit the vessels to each other at the parting plane, the pressure receiving area of the gas pressure ram 18 is designed to be larger than the area regulated by the outer diameter of the seal ring part of the high-pressure gas processing space 5.

According to such a design, the vessel 1 formed of the upper and lower members 2, 3 is regularly kept in the state where the both are closely fitted at the parting plane as long as the gas pressure is supplied, and the high-pressure gas in the high-pressure gas processing space 5 can be prevented from being leaked out through the parting plane of both the members by the synergistic effect with the sealing effect of the resin-made seal ring 9 which is the elastic body.

The combination of the window frame-like press frame (press frame) 19 with these means allows to provide an apparatus compact as the whole and excellent in safety. Namely, in the window frame type press frame, the sectional area of a column part is regulated, whereby the axial elongation can be substantially optionally selected, and the stress level is regulated, whereby a design can be made, including a fatigue evaluation as resistant to use at the level of 10,000,000 times or more even to the use of a high pressure exceeding 1000 kgf/cm$^2$.

It is recommended to divide the press frame 19 into two parts as shown in FIG. 1 (A), (B) and FIG. 2, and provide a gas introducing means 20 having a feed and discharge port 20A for pressure medium gas between the two frames, or in the central axial part of the high-pressure vessel. According to such an arrangement, the turbulence of temperature within the high-pressure gas processing space generated in the high-speed supply of the high-pressure gas indispensable in a high-temperature high pressure gas processing in a short cycle of several minutes/cycle can be made axially symmetric, and the management of temperature distribution of the workpiece is facilitated.

Namely, the introducing member 20B of the gas introducing means 20 is provided on the axial center of the vessel 1, the window frame press frames 19 are provided on both sides with the introducing member 20B between in such a manner that the press frames 19 are mutually movable near and away on both sides with the introducing member 20B between to be engaged with and disengaged from both end surfaces of the vessel 1.

In FIG. 1 (B) and FIG. 2, the cotter 16 forming an interlocking structure only by being slid on the operating side of the actuator 21 in a short distance is used, and the division (opening) of the upper member 2 and the lower member 3 in unloading of the workpiece in a general operation is performed by shifting the cotter 16 to form the interlocking state, and driving the actuator 11 for raising and lowering the lower member 3 to press the lower member 3 downward. This state is shown in FIG. 2. In the state where the high-pressure vessel is opened at the parting plane, the arm of a robot arm type carrying device (not shown) connected to a vacuum chamber is inserted from the left side of the drawing to deliver a wafer which is the workpiece. At this time, the gas pressure ram is set to the state having no gas pressure.

The press frame 19 can be engaged and disengaged by being placed on a rail 22 through a frame truck 23, and the opening and closing (engagement and disengagement) of the frames 19 are provided in order to perform the replacement of the seal ring 9, or the replacement of a consumable member such as heater in the high-pressure gas processing space 5, or to remove the upper high-pressure vessel upward to perform a work when the wafer is broken in the processing space.

Figure 3:
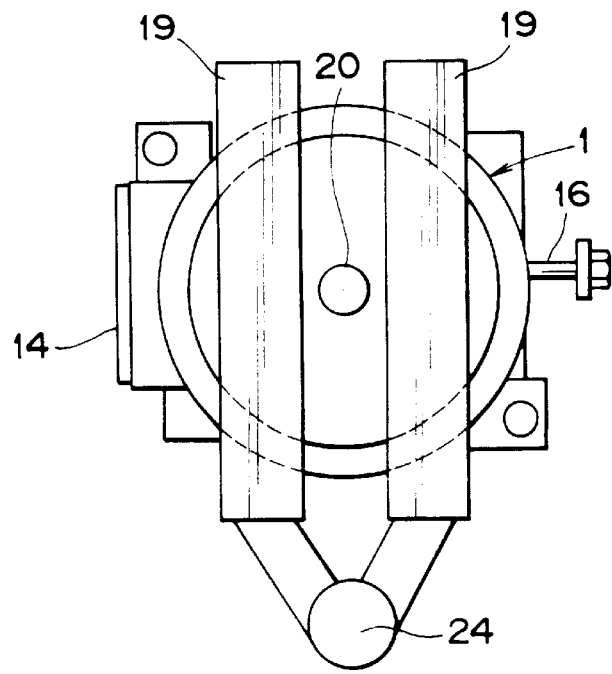
FIG. 3 is a plane view showing an essential part of another embodiment off this invention.

Thus, the holding method of the press frame is not limited by this drawing, and the two frames may be fixed by a hinge in the lower part or side part. In FIG. 3, a rocking type press frame 19 opened and closed with a pivot 24 as fulcrum is shown.

Figure 6:
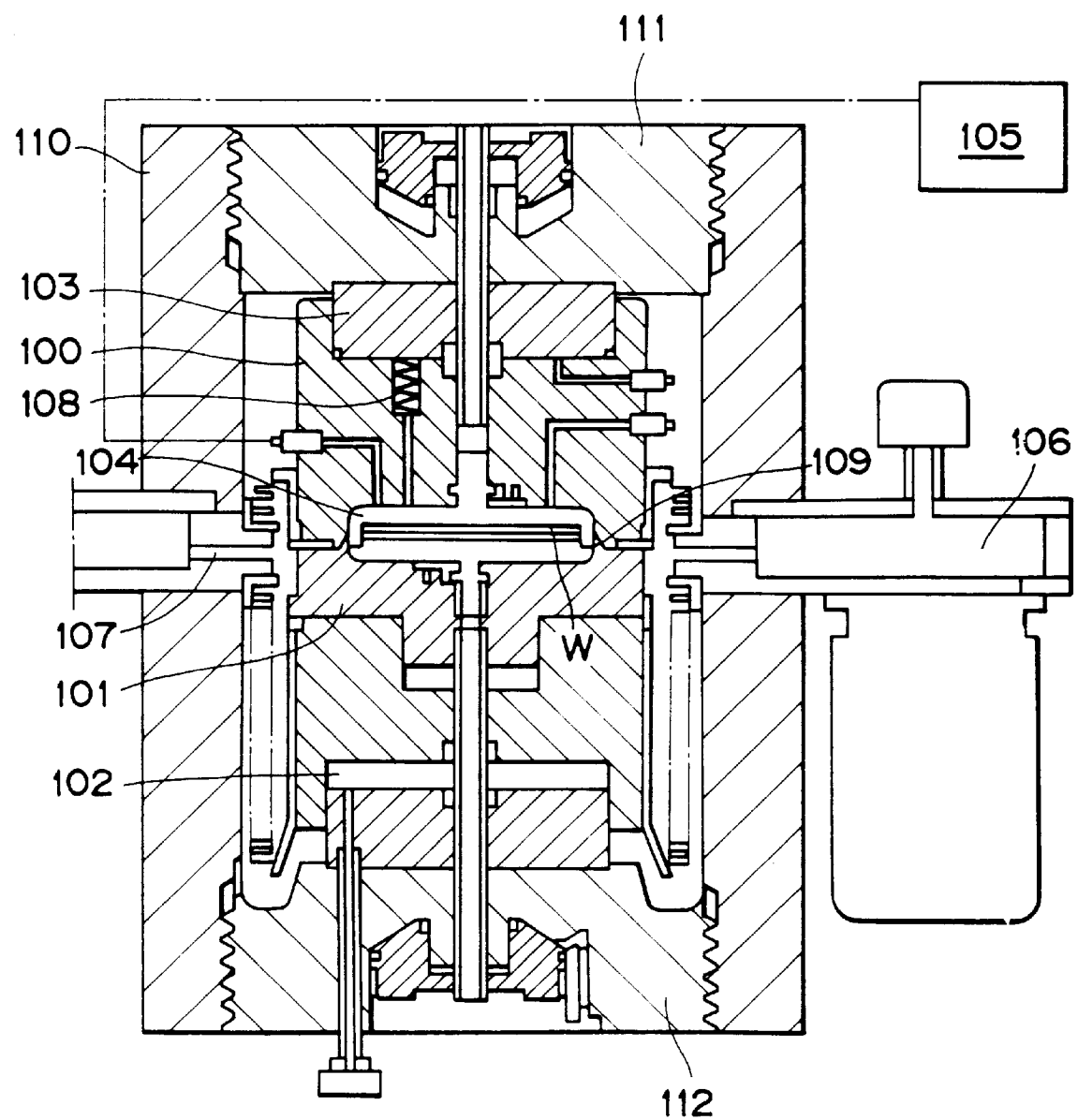
FIG. 6 is a structural view of a conventional technique.

In the press frame 19, any form such as column form (in which upper platen and lower bottom are bonded by a column), wire-winding form and the like can be optionally adapted, and the axial force may be supported not by the press frame as shown in the conventional example of FIG. 6, but by the upper and lower members 2, 3 including a plug screwed thereto.

In the embodiment described above, further, a seal ring groove 9A is formed on the section of the lower member 3 as shown in FIG. 1 (C), and the seal ring 9 is fitted to the groove 9A in such a manner as to be replaceable. This seal ring groove 9A can be formed of a plurality of inner and outer ring grooves, and is desirably provided on the dividing surface of the lower member 3 from the viewpoint of easiness of replacement of the seal ring 9 as described above, although it may be provided on the upper member 2.

When the seal ring 9 is provided on either one or the both of the upper and lower members 2, 3 in such a manner as to be replaceable, a plurality of the passages 10A of cooling water may be provided, not singly as shown in FIG. 1 (C), so as to surround the seal ring 9.

Figure 4:
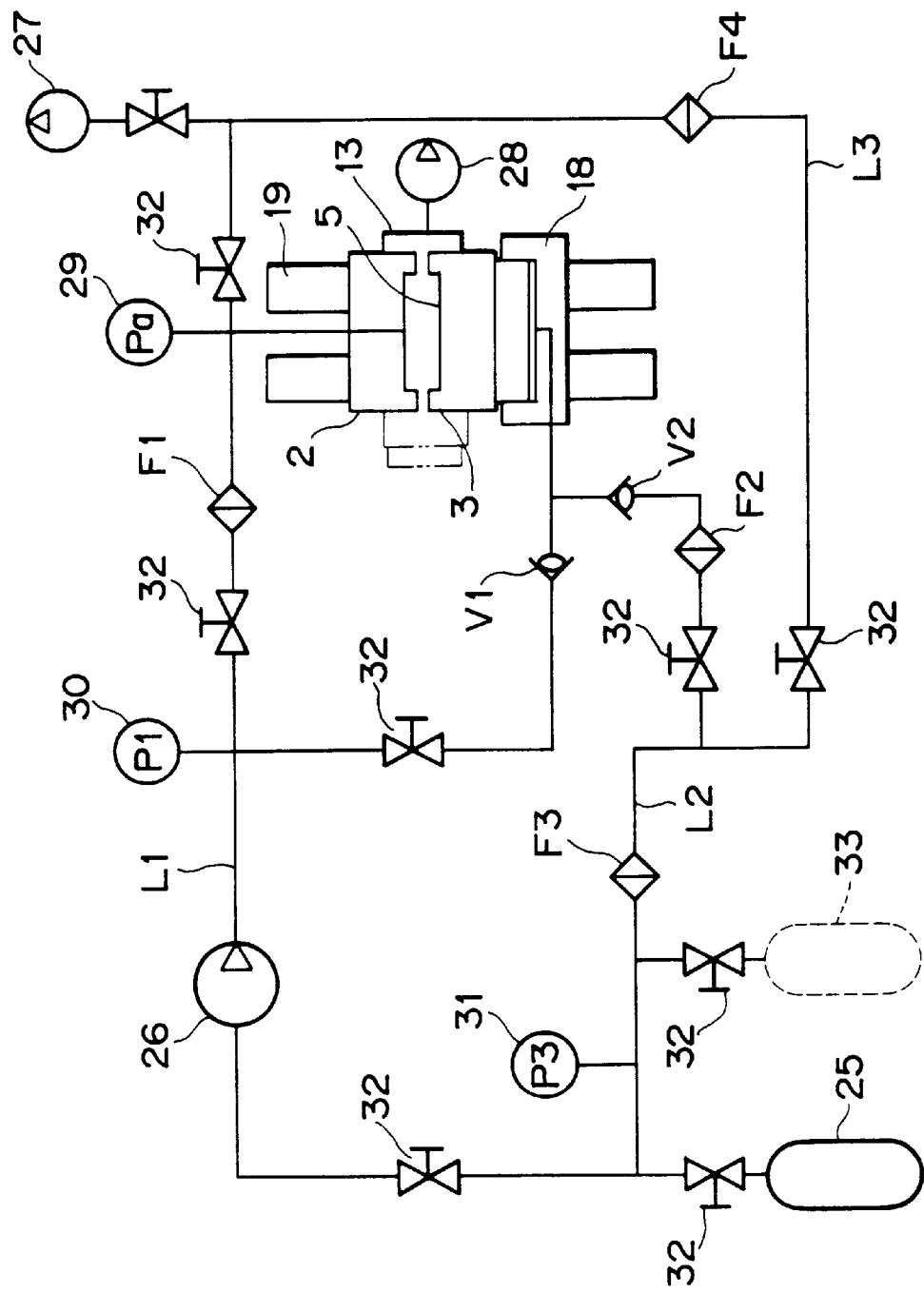
FIG. 4 is a schematic view of one embodiment of gas feeding and recovering lines in the heating pressure processing apparatus of this invention.
Figure 5:
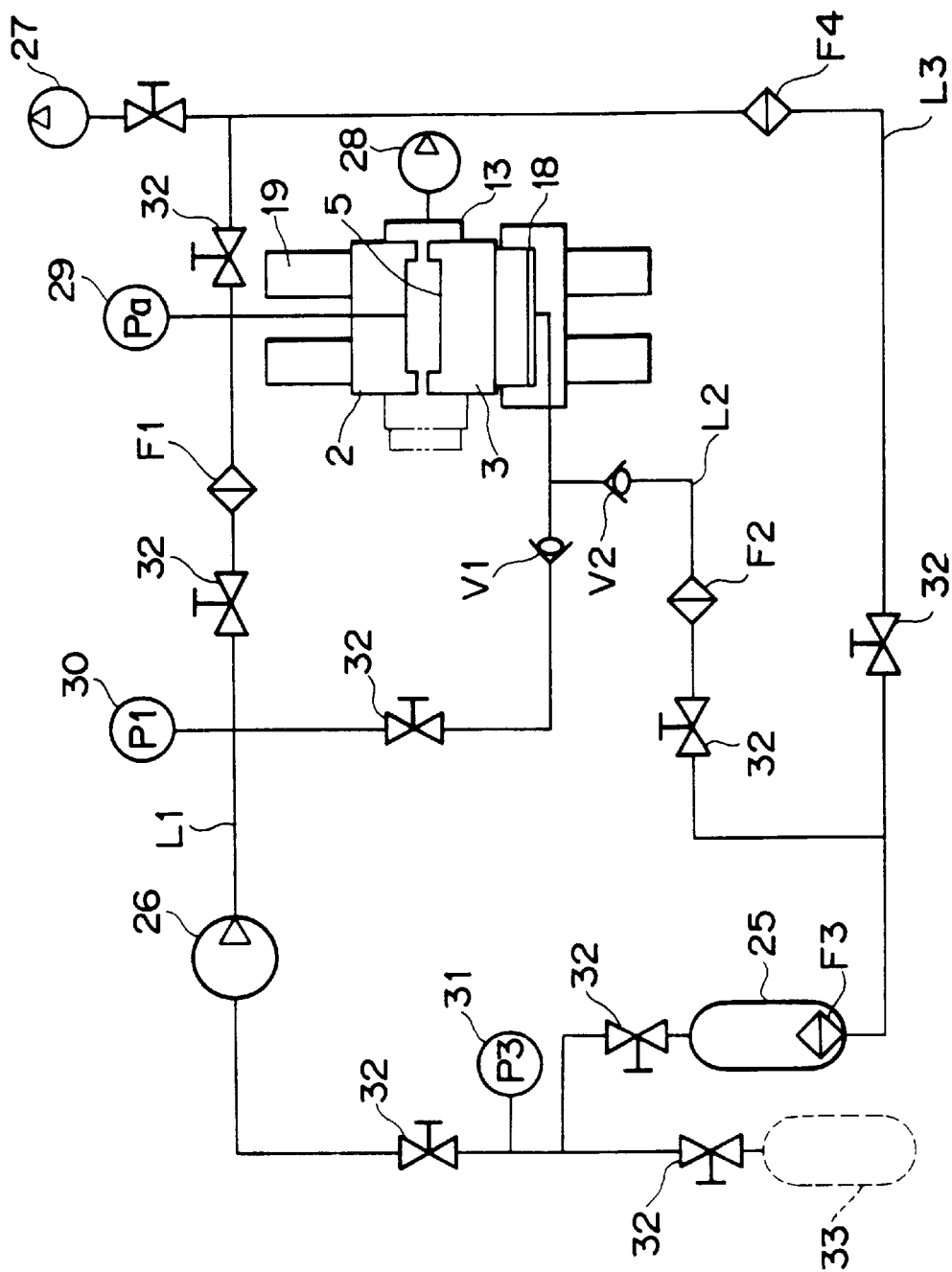
FIG. 5 is a schematic view showing another embodiment of gas feeding line in the heating pressure processing apparatus of this invention.

Referring to FIG. 4 and FIG. 5, one pressing means for pressing the upper and lower members 2, 3 in the axial direction thereof in order to ensure the sealing in the divided part of the both is formed of a ram 18 utilizing gas pressure, and as preferred embodiments of this invention, the structure having check valves V1, V2 for allowing the gas flow from feed side to recovery side and arresting the reverse directional gas flow on the feeding and recovering line L1, L2 of pressure medium gas to and from the ram 18, and the structure having filters F2–F4 for removing dust in the recovered gas on the recovering line L2 from the gas pressure ram 18 or on a recovering vessel 25 are shown.

Namely, the piping system is constituted so that the high-pressure gas supplied by the drive of a gas compressor 26 is regularly carried in one direction, whereby dust (particles) such as abrasive powder generated by the wear of the gas seal ring within the ram, even if contained in the gas supplied into the gas pressure ram 18, can be prevented from being transferred to the high-pressure gas processing space 5 to cause a contamination. Concretely, as shown in FIG. 4, the gas is supplied from the same supplying source to the high pressure gas processing space 5 and the gas pressure ram 18, and the check valves V1, V2 are provided only in the piping system of the gas pressure ram 18 so that the gas regularly flows only from feed side to discharge side. Although the check valves V1, V2 can be provided on both inlet side and outlet side of the gas pressure ram as shown in FIG. 4, it is preferably provided on the outlet side when used alone. In this case, the gas supplying piping to the high-pressure gas processing space 5 of the body and a discharging (recovering) piping having a vacuum pump 27 are preferably independently provided so that the gas does not flow back from the gas pressure ram to the body vessel.

According to such an arrangement, the state where the pressure of the gas pressure ram is regularly higher than the high pressure gas processing space is formed, and the force acting on the parting plane of both the vessels can be consequently compensated.

In processing a large quantity of products, the gas is recovered and recycled. In this case, also, it is important to remove of dust such as abrasive powder generated within the gas pressure ram 18. Therefore, the use of a filter having a proper aperture diameter in combination is indispensable.

In this invention, the filters F2, F3 are provided in the gas returning circuit L2 from the gas pressure ram 18 to the recovering pump 25 as shown also in FIG. 4, in addition to the filter F1 provided on the gas supplying circuit L1 to the high-pressure gas processing space 5 of the body, whereby the recovered gas can be recycled. Besides the returning and recovering circuit from the gas pressure ram as shown in the drawing, the filter is preferably provided also on the gas recovering circuit L3 from the high-pressure gas processing space 5 of the body as shown by reference numeral F4. Particularly, when the check valves V1, V2 are provided on the piping system of the gas pressure ram 18 as described above, in order to avoid the problem of the resistance to gas flow of the filter similarly to the resistance of the check valve V2, it is preferred, from the view point of prevention of the damage by differential pressure of the filter, that filter vessels for housing the filters F2, F3 are set as much as possible, whereby the gas passing sectional area in the filter part is increased to suppress the flow velocity of the gas low. As the same way of thinking as the enlargement of the filter vessel, it is also recommended to install the filter F3 into the gas recovering vessel 25 as shown in FIG. 5 to use a filter of a large area capable of catching fine particles in the state with a minimum flow velocity.

In FIG. 4 and FIG. 5, denoted at 28 is a chamber vacuum pump, 29–31 are pressure gauges, 32 is an opening and closing valve, and 33 is a gas supplying gas storage tank.

The gas recovering means of differential pressure recovery type are shown in FIG. 4 and FIG. 5, but a forced recovery type may be of course employed.

Further, a hydraulic ram may be adapted instead of the gas pressure ram 18 in FIG. 2. In this case, the gas inlet port 18A corresponds to a hydraulic inlet port. To the hydraulic ram, an oil pressure sufficient to generate a force larger than the axial load generated by the gas pressure filled in the processing chamber space is supplied. The magnitudes of the hydraulic pressure and sectional area of the hydraulic ram are determined so as to satisfy the above condition. The use of hydraulic pressure requires a separate hydraulic system, compared with the ram utilizing the pressure medium gas, but the check valves and filters are not required for the pressure medium gas system.

As described above, according to this invention, the problems possessed by the heating pressure processing apparatus by the conventional technique outlined in reference to FIG. 6 can be solved, and an apparatus usable for an actual industrial production of the level exceeding 1,000,000 times in a short cycle of several minutes can be provided. According to the high degree integration of circuits on Si wafers, spread of the process utilizing high pressure, including pressure recess-filling processing is expected, and this invention will make much for such industrial use.

What is claimed is:

1. An apparatus for heating and processing a workpiece under conditions of high-pressure gas atmosphere, comprising:

a high-pressure vessel formed of a plurality of vessel components, said vessel components being mutually closed to form a closed processing space;

an actuator connected for moving the vessel components of said high-pressure vessel in the axial direction thereof;

a heater provided in said high-pressure vessel;

gas introducing means for introducing a pressurized gas to said closed processing space;

sealing means fitted to the contact parts of said vessel components; and pressing means for pressing said vessel components in the axial direction of said high pressure vessel.

2. An apparatus according to claim 1, further comprising a frame for supporting a load acting in an axial direction of said high pressure vessel in high-pressure processing the workpiece within said high-pressure vessel and retractable cotter means for transmitting the load acting in the axial direction of said high-pressure vessel to said frame.

3. An apparatus according to claim 2, wherein said frame has a window frame form.

4. An apparatus according to claim 3, further comprising an introducing member for said gas introducing means positioned on the axial center of said high pressure vessel, wherein one of said frames is provided on each side of said introducing member.

5. An apparatus according to claim 4, wherein said frames are mutually movable toward and away from one another on both sides of said introducing member.

6. An apparatus according to claim 2, wherein said sealing means is formed of an elastic sealant.

7. An apparatus according to claim 6, having means for cooling said sealing means.

8. An apparatus according to claim 2, wherein said pressing means is formed of a ram utilizing the pressure of a pressure medium gas, and a pressure receiving area of the ram is larger than a pressure receiving area of the processing space.

9. An apparatus according to claim 8, further comprising valves for allowing gas flow from a feed side to a recovery side and arresting a reverse directional gas flow provided on feeding and recovering lines of the pressure medium gas to and from said ram.

10. An apparatus according to claim 8, further comprising a filter for removing dust in the recovered gas and provided in recovering line of the pressure medium gas from said ram or a recovering vessel thereof.

11. An apparatus according to claim 2, wherein said pressing means is formed of a hydraulic ram.

12. An apparatus according to claim 1, wherein said sealing means is formed of an elastic sealant.

13. An apparatus according to claim 12, having means for cooling said sealing means.

14. An apparatus according to claim 1, wherein said pressing means is formed of a ram utilizing a pressure of a pressure medium gas, and the pressure receiving area of a ram is larger than the pressure receiving area of the processing area.

15. An apparatus according to claim 14, further comprising check valves for allowing gas flow from a feed side to a recovery side and arresting a reverse directional gas flow provided on feeding and recovering lines of the pressure medium gas to and from said ram.

16. An apparatus according to claim 14, further comprising a filter for removing dust in a recovered gas and provided on the recovering line of the pressure medium gas from said ram or a recovering vessel thereof.

17. An apparatus according to claim 1, wherein said pressing means is formed of a hydraulic ram.

* * * * *